(12) United States Patent
Ikawa et al.

(10) Patent No.: US 12,040,348 B2
(45) Date of Patent: Jul. 16, 2024

(54) IMAGE DISPLAY ELEMENT

(71) Applicant: Sharp Fukuyama Laser Co., Ltd., Fukuyama (JP)

(72) Inventors: Yuta Ikawa, Fukuyama (JP); Shinji Yamaguchi, Fukuyama (JP); Osamu Jinushi, Fukuyama (JP); Naoto Momotani, Fukuyama (JP); Kyohei Mikami, Fukuyama (JP)

(73) Assignee: Sharp Fukuyama Laser Co., Ltd., Fukuyama (JP)

( * ) Notice: Subject to any disclaimer, the term of this patent is extended or adjusted under 35 U.S.C. 154(b) by 408 days.

(21) Appl. No.: 17/538,216

(22) Filed: Nov. 30, 2021

(65) Prior Publication Data

US 2022/0173161 A1 Jun. 2, 2022

(30) Foreign Application Priority Data

Dec. 2, 2020 (JP) ................. 2020-200338

(51) Int. Cl.
  *H01L 27/15* (2006.01)
  *H01L 25/075* (2006.01)
  (Continued)

(52) U.S. Cl.
  CPC .......... *H01L 27/156* (2013.01); *H01L 33/007* (2013.01); *H01L 33/0093* (2020.05);
  (Continued)

(58) Field of Classification Search
  CPC ......... H01L 33/24; H01L 33/38; H01L 33/44; H01L 33/46; H01L 33/60; H01L 33/62;
  (Continued)

(56) References Cited

U.S. PATENT DOCUMENTS

2018/0254226 A1* 9/2018 Iguchi ................... H01L 27/156
2018/0308420 A1 10/2018 Shin et al.
(Continued)

FOREIGN PATENT DOCUMENTS

CN 111725251 A 9/2020

OTHER PUBLICATIONS

Francois Olivier et al., "Investigation and Improvement of 10μm Pixel-pitch GaN-based Micro-LED Arrays with Very High Brightness", SID 2017 Digest, p. 353-356, France, 2017.

*Primary Examiner* — Mohsen Ahmadi
(74) *Attorney, Agent, or Firm* — ScienBiziP, P.C.

(57) ABSTRACT

An image display element, provided with a pixel region and a connection region, includes a light-emitting unit and a driving circuit substrate. The light-emitting unit includes a semiconductor layer obtained by layering a second conductive layer, a light-emitting layer, and a first conductive layer, mesa shapes formed by dividing the semiconductor layer, and a step portion separated from the mesa shapes by a groove. A first electrode is connected to the first conductive layer and a first driving electrode. The light-emitting unit further includes, between the mesa shapes adjacent to each other, a wiring line layer forming a conductive path, the wiring line layer being thinner than a layer thickness of a portion of each of the mesa shapes in the semiconductor layer. The wiring line layer extends to a top of the step portion and is connected to a common second electrode provided on the step portion.

10 Claims, 17 Drawing Sheets

(51) Int. Cl.
*H01L 25/16* (2023.01)
*H01L 33/00* (2010.01)
*H01L 33/24* (2010.01)
*H01L 33/38* (2010.01)
*H01L 33/44* (2010.01)
*H01L 33/60* (2010.01)
*H01L 33/62* (2010.01)

(52) U.S. Cl.
CPC .............. *H01L 33/24* (2013.01); *H01L 33/38* (2013.01); *H01L 33/44* (2013.01); *H01L 33/60* (2013.01); *H01L 33/62* (2013.01); *H01L 2933/0016* (2013.01); *H01L 2933/0025* (2013.01); *H01L 2933/0066* (2013.01)

(58) Field of Classification Search
CPC ... H01L 33/382; H01L 33/385; H01L 33/405; H01L 27/156; H01L 25/0753; H01L 25/167
See application file for complete search history.

(56) References Cited

U.S. PATENT DOCUMENTS

| | | | |
|---|---|---|---|
| 2019/0273179 A1* | 9/2019 | Iguchi | .................. H01L 25/0753 |
| 2019/0393387 A1* | 12/2019 | Kwon | ..................... H01L 27/15 |
| 2020/0152693 A1 | 5/2020 | Zou et al. | |
| 2020/0176655 A1* | 6/2020 | Iguchi | ..................... H01L 33/62 |
| 2020/0343410 A1* | 10/2020 | Iguchi | .................. H01L 25/0753 |
| 2020/0350362 A1* | 11/2020 | Iguchi | .................. H01L 33/405 |
| 2021/0020619 A1* | 1/2021 | Iguchi | .................. H01L 33/405 |
| 2021/0151422 A1* | 5/2021 | Iguchi | .................. H01L 33/405 |

* cited by examiner

1: PIXEL REGION
2: CONNECTION REGION
3: IMAGE DISPLAY ELEMENT
4: MARK REGION

1: PIXEL REGION
10: SECOND CONDUCTIVE LAYER
10a: REGION OF SECOND CONDUCTIVE LAYER ON LIGHT EMISSION SIDE
10b: REGION OF SECOND CONDUCTIVE LAYER FORMED IN MESA SHAPE
11: LIGHT EMISSION LAYER
12: FIRST CONDUCTIVE LAYER
13: SEMICONDUCTOR LAYER
14: P CONTACT FILM
18: PROTECTION FILM
30: P ELECTRODE
31: WIRING LINE LAYER
60: ELEMENT SEPARATION GROOVE
100: LIGHT-EMITTING ELEMENT
113: MESA SHAPE

2: CONNECTION REGION
10: SECOND CONDUCTIVE LAYER
10a: REGION OF SECOND CONDUCTIVE LAYER ON LIGHT EMISSION SIDE
10b: REGION OF SECOND CONDUCTIVE LAYER FORMED IN MESA SHAPE
11: LIGHT EMISSION LAYER
12: FIRST CONDUCTIVE LAYER
13: SEMICONDUCTOR LAYER
15: CONTACT FILM
18: PROTECTION FILM
31: WIRING LINE LAYER
32: COMMON SECOND ELECTRODE
61: GROOVE
213: STEP PORTION

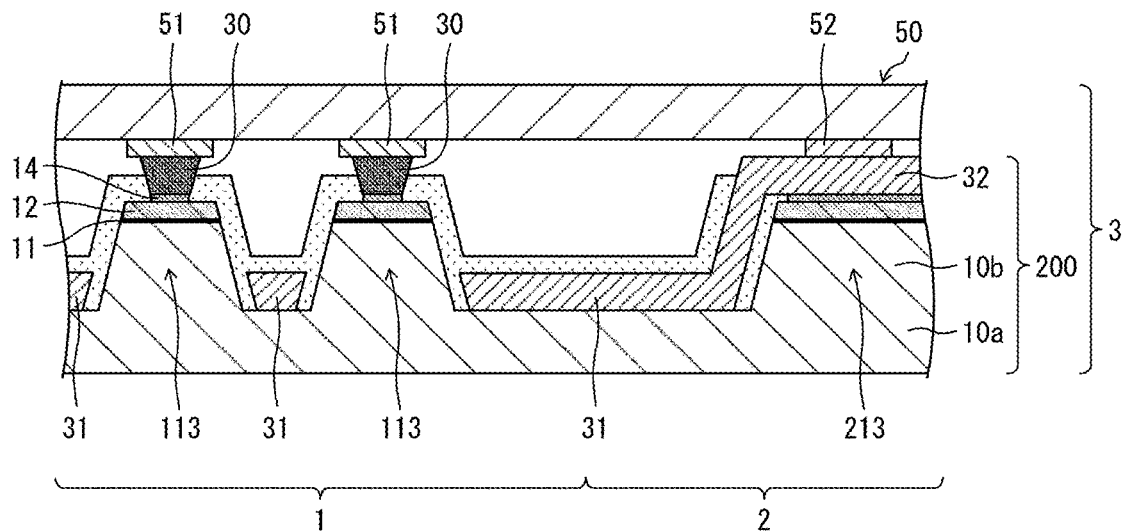

1: PIXEL REGION
2: CONNECTION REGION
3: IMAGE DISPLAY ELEMENT
10a: REGION OF SECOND CONDUCTIVE LAYER ON LIGHT EMISSION SIDE
10b: REGION OF SECOND CONDUCTIVE LAYER FORMED IN MESA SHAPE
11: LIGHT EMISSION LAYER
12: FIRST CONDUCTIVE LAYER
14: P CONTACT FILM
30: P ELECTRODE
31: WIRING LINE LAYER
32: COMMON SECOND ELECTRODE
50: DRIVING CIRCUIT SUBSTRATE
51: ANODE ELECTRODE
52: CATHODE ELECTRODE
113: MESA SHAPE
200: LIGHT-EMITTING UNIT
213: STEP PORTION

FIG. 5

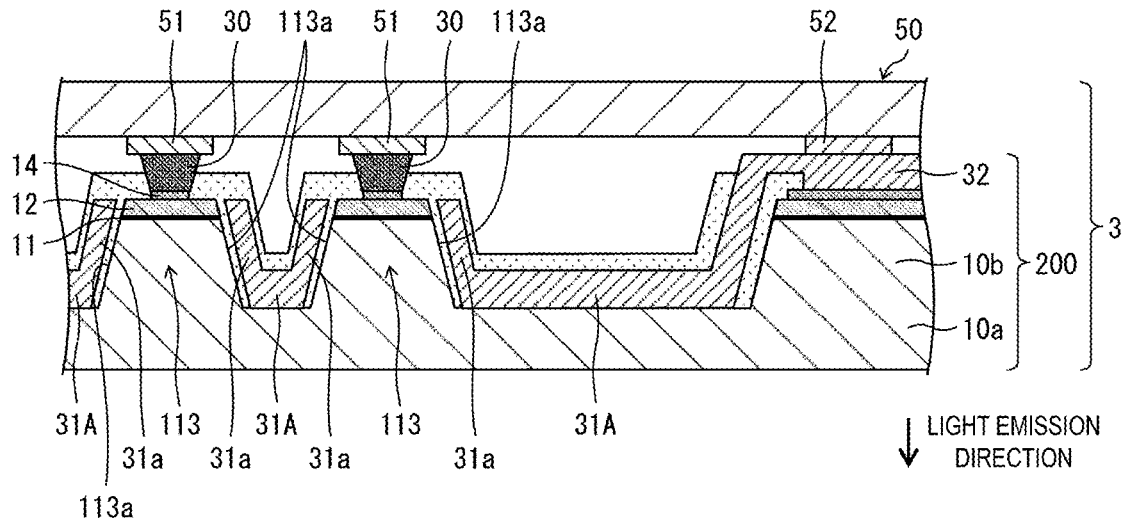

3: IMAGE DISPLAY ELEMENT
10a: REGION OF SECOND CONDUCTIVE LAYER ON LIGHT EMISSION SIDE
10b: REGION OF SECOND CONDUCTIVE LAYER FORMED IN MESA SHAPE
11: LIGHT EMISSION LAYER
12: FIRST CONDUCTIVE LAYER
14: P CONTACT FILM
30: P ELECTRODE
31a: PORTION OF WIRING LINE LAYER ON MESA SHAPE SIDE
31A: WIRING LINE LAYER
32: COMMON SECOND ELECTRODE
50: DRIVING CIRCUIT SUBSTRATE
51: ANODE ELECTRODE
52: CATHODE ELECTRODE
113: MESA SHAPE
113a: SIDEWALL OF MESA SHAPE
200: LIGHT-EMITTING UNIT

FIG. 8

IMAGE DISPLAY ELEMENT

CROSS-REFERENCE TO RELATED APPLICATION

The present application claims priority from Japanese Patent Application Number 2020-200338, the content to which is hereby incorporated by reference into this application.

BACKGROUND OF THE INVENTION

1. Field of the Invention

An aspect of the disclosure relates to an image display element, and more particularly relates to an image display element including a micro light-emitting element.

2. Description of the Related Art

There are known display elements that include a plurality of micro light-emitting elements constituting a pixel in an array on a driving circuit substrate. Such display elements have characteristics such as small size, high brightness, and high durability. Thus, such display elements are mounted as display elements for display devices such as glasses-type terminals or head-up displays (HUDs).

Further, a large number of micro mesa structures are known to be formed on a front surface of a display element including micro light-emitting diodes (LEDs) in an array in order to improve light extraction efficiency. In such a display element, there is a mode in which a cathode electrode is disposed in the array of micro LEDs, but there is an issue in that a light-emitting area decreases as an area of the cathode electrode increases and an issue in that the pixel region is large.

In response to such issues, a mode has been proposed in which the cathode electrode is disposed outside the array (US 2018/308,420 A1 and US 2020/152,693 A1). Furthermore, a technique of filling spaces between the mesas with a material having high reflectivity to improve light extraction efficiency has also been proposed (Francois Olivier, Anis Daami, Ludovic Dupre, Franck Henry, Bernard Aventurier, Francois Templier, "Investigation and Improvement of 10 µm Pixel-pitch GaN-based Micro-LED Arrays with Very High Brightness," SID 2017 Digest, P353).

SUMMARY OF THE INVENTION

By arranging the cathode electrode outside the array, the quality of the light source can be improved in comparison to a mode in which the cathode electrode is disposed inside the array. Nevertheless, in the modes of US 2018/308,420 A1 and US 2020/152,693 A1 in which the cathode electrode is disposed outside the array, there is concern that the resistance of the common cathode structure disposed in the pixel region prevents light source quality improvement.

Further, with the mode of filling the spaces between mesas with a material having high reflectivity, such as in Francois Olivier, Anis Daami, Ludovic Dupre, Franck Henry, Bernard Aventurier, Francois Templier, "Investigation and Improvement of 10 µm Pixel-pitch GaN-based Micro-LED Arrays with Very High Brightness," SID 2017 Digest, P353, there is a risk of causing warping of the light-emitting element.

An aspect of the disclosure has been made in view of the aforementioned issues, and an object of the disclosure is to provide an image display element including a micro light-emitting element having high light source quality.

To solve the issues described above, an image display element according to an aspect of the disclosure is an image display element provided with a pixel region configured to display an image and a connection region provided outside the pixel region. The image display element includes a light-emitting unit including a plurality of light-emitting elements disposed in an array in the pixel region, and a driving circuit substrate facing the light-emitting unit and configured to drive the plurality of light-emitting elements. The light-emitting unit includes a semiconductor layer obtained by layering a second conductive layer, a light-emitting layer, and a first conductive layer in the pixel region and the connection region, a plurality of mesa shapes formed by dividing the semiconductor layer into portions corresponding to each of the plurality of light-emitting elements in the pixel region, and a step portion separated from the plurality of mesa shapes by a groove formed in the semiconductor layer in the connection region. A first electrode is connected to the first conductive layer of each of the plurality of mesa shapes. The first electrode is connected to a first driving electrode provided on an opposing surface of the driving circuit substrate facing the light-emitting unit. The light-emitting unit further includes, between the plurality of mesa shapes adjacent to each other, a wiring line layer forming a conductive path between the second conductive layers of the plurality of mesa shapes, the wiring line layer being thinner than a layer thickness of a portion of each of the plurality of mesa shapes in the semiconductor layer. The wiring line layer extends to a top of the step portion and is connected to a common second electrode provided on the step portion. The common second electrode is connected to a second driving electrode provided on the opposing surface of the driving circuit substrate.

According to an aspect of the disclosure, an image display element including a micro light-emitting element having high light source quality can be provided.

BRIEF DESCRIPTION OF THE DRAWINGS

FIG. 5 is an aligned section view of the image display element along the cutting line B-B' illustrated in FIG. 1 and FIG. 2.

FIG. 8 is a partial cross-sectional view of an image display element according to a second embodiment of the disclosure.

DETAILED DESCRIPTION OF THE INVENTION

First Embodiment

An embodiment of an image display element according to the disclosure will be described in detail below.

(1) Configuration of Image Display Element

Figure 1:
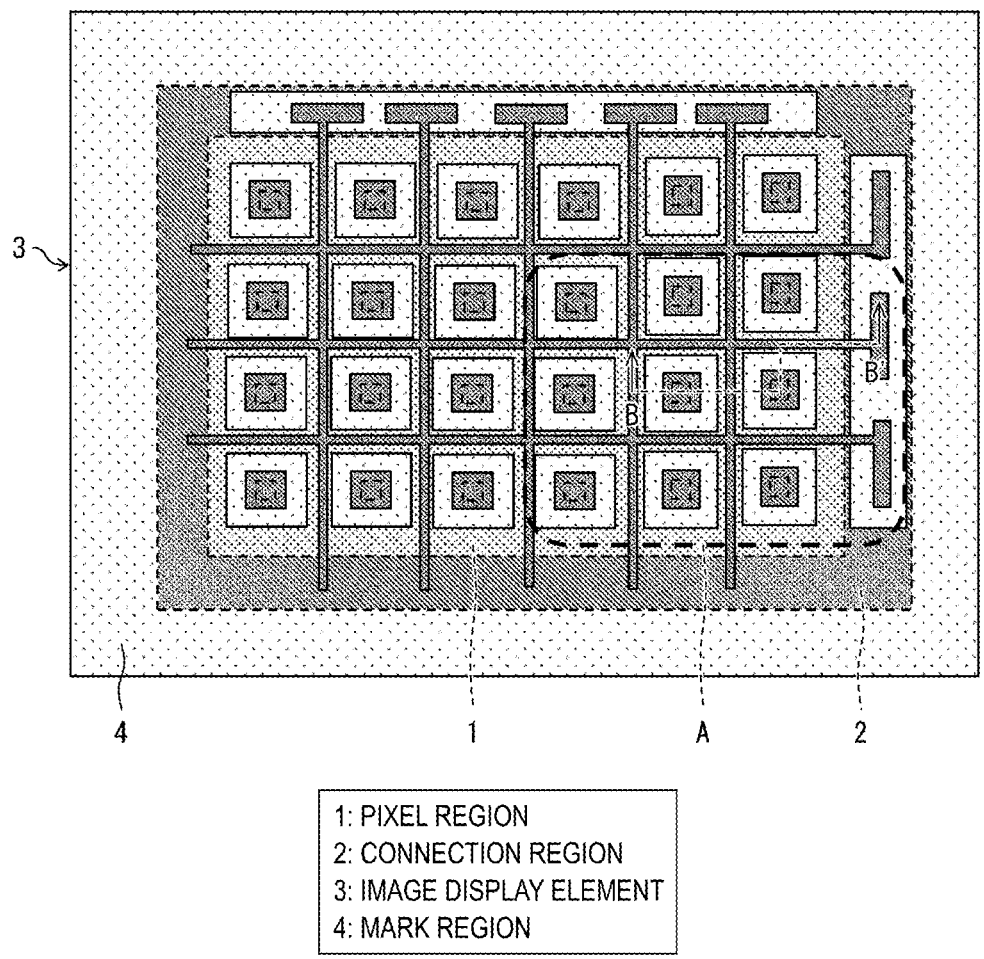
FIG. 1 is a top view of an image display element according to a first embodiment of the disclosure.
Figure 2:
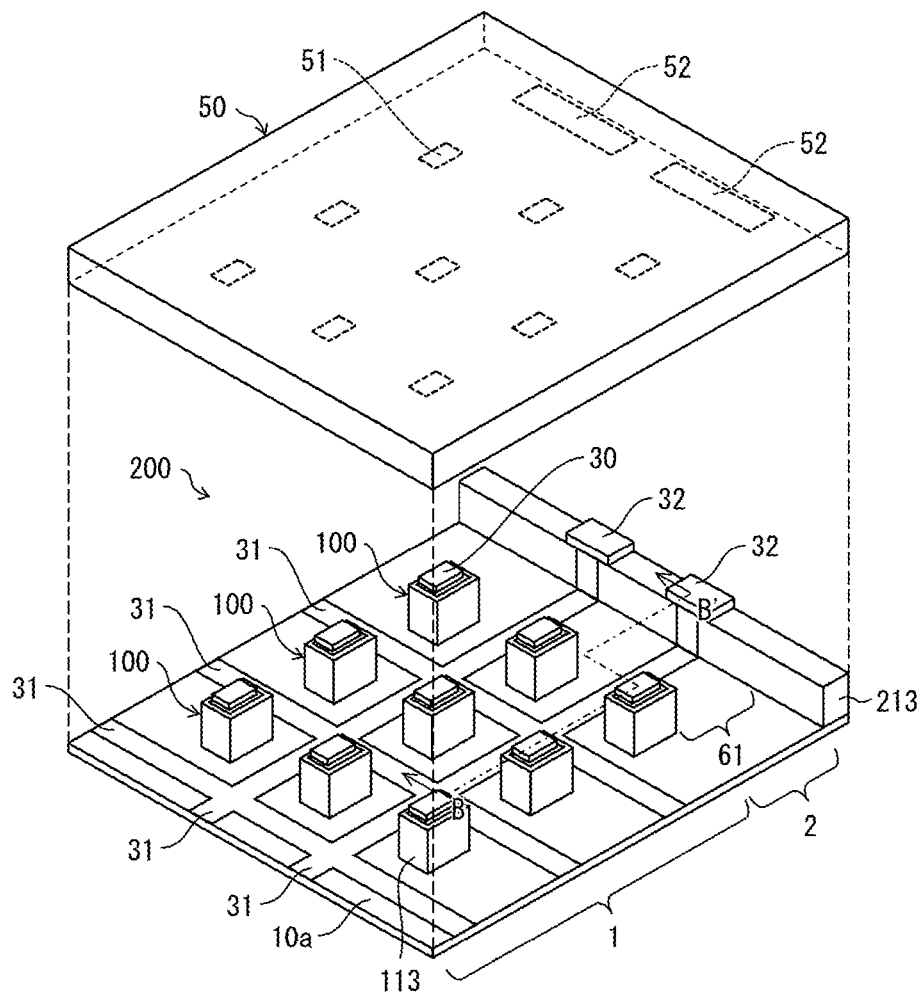
FIG. 2 is an exploded perspective view illustrating a configuration of a portion of the image display element illustrated in FIG. 1.

FIG. 1 is a top view of an image display element 3 according to the present embodiment. FIG. 2 is an exploded perspective view illustrating a configuration of the image display element 3 in a region A illustrated in FIG. 1. Note that the number of installed components is not limited to the number illustrated in the drawings.

The image display element 3 is an image display element equipped with a micro light-emitting diode (LED) unit as a light source. Therefore, as illustrated in FIG. 2, the image display element 3 includes a light-emitting unit 200 in which a plurality of micro LED chips (light-emitting elements 100) are arranged in an array, and a driving circuit substrate 50 facing the light-emitting unit 200 and configured to drive the plurality of light-emitting elements 100.

In the top view illustrated in FIG. 1, the image display element 3 includes a pixel region 1 provided in a center and a connection region 2 provided outside the pixel region 1. In the pixel region 1, the plurality of light-emitting elements 100 are arranged in an array, and anode electrodes 51 (first driving electrodes) that connect to P electrodes 30 (first electrodes) provided to each light-emitting element 100 are provided on a surface of the driving circuit substrate 50 facing the light-emitting unit 200. In the connection region 2, a common second electrode 32 (N electrode) common to the plurality of light-emitting elements 100 is disposed, and a cathode electrode 52 (second driving electrode) that connects to the common second electrode 32 is provided on a surface of the driving circuit substrate 50 facing the light-emitting unit 200.

Furthermore, in the image display element 3 of the present embodiment, a semiconductor layer 13 having a layered structure formed in the light-emitting unit 200 forms a plurality of mesa shapes 113 in the pixel region 1, and forms a step portion 213 in the connection region 2. Then, as described in detail below, each of the plurality of mesa shapes 113 constitutes the light-emitting element 100, and the P electrode 30 is formed on each mesa shape. On the other hand, the common second electrode 32 is formed on the step portion 213. Further, a wiring line layer 31 extending between the mesa shapes 113 and connected to a second conductive layer 10 (N-type layer) of the semiconductor layer 13 is provided, and the wiring line layer 31 is connected to the common second electrode 32.

Note that the image display element 3 is provided with a mark region 4 outside the connection region 2 as illustrated in FIG. 1. The mark region 4 is, for example, a mark used for alignment when the light-emitting elements 100 and the driving circuit substrate 50 are bonded to each other, and may be a mark for indicating coordinates of a plurality of arrays of the light-emitting element 100.

The image display element 3 has a configuration in which light emitted by the light-emitting elements 100 is emitted to a side opposite to the driving circuit substrate 50. Note that a wavelength conversion layer, a light diffusion layer, a color filter, and the like may be provided on the light emission side, but are not directly related to an aspect of the disclosure, and thus description thereof is omitted and not illustrated.

The light-emitting unit 200 and the driving circuit substrate 50 will be described in detail below.

(2) Light-Emitting Unit

Figure 3:
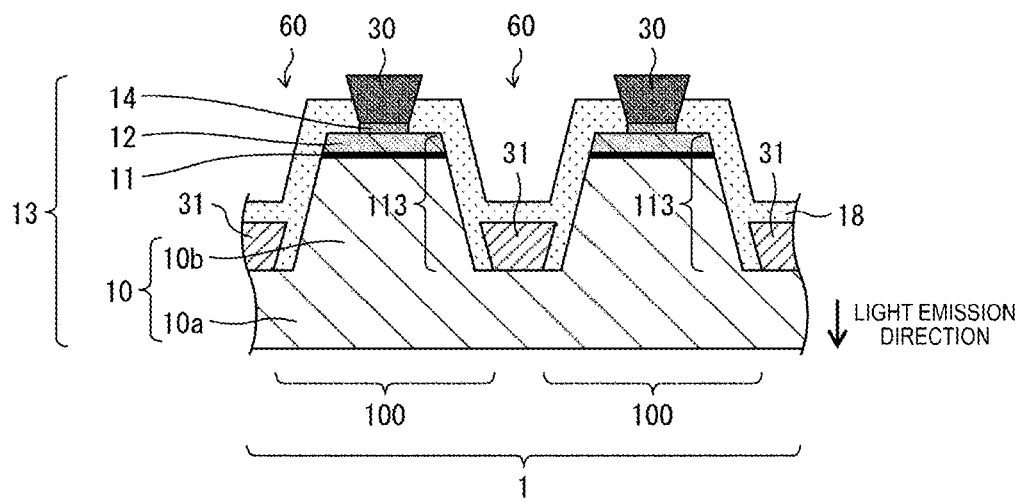
FIG. 3 is an aligned section view of a pixel region of a light-emitting unit provided in the image display element along the cutting line B-B' illustrated in FIG. 1 and FIG. 2.
Figure 4:
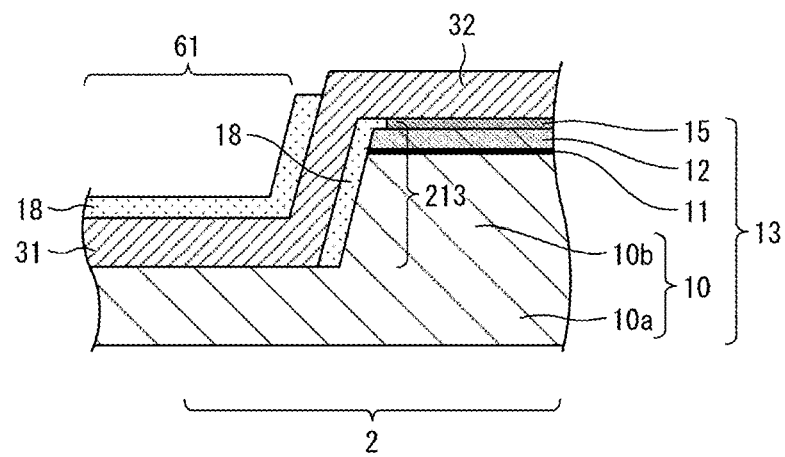
FIG. 4 is an aligned section view of a connection region of the light-emitting unit provided in the image display element along the cutting line B-B' illustrated in FIG. 1 and FIG. 2.

FIG. 3 and FIG. 4 are aligned section views along the cutting line B-B' illustrated in FIG. 1 and FIG. 2, FIG. 3 illustrates a cross section of the pixel region 1, and FIG. 4 illustrates a cross section of the connection region 2. Note that, for convenience of explanation, the driving circuit substrate 50 is omitted from the drawings in FIG. 3 and FIG. 4.

As described above, the light-emitting unit 200 includes the semiconductor layer 13 obtained by layering the second conductive layer 10, a light-emitting layer 11, and a first conductive layer 12 in the pixel region 1 and the connection region 2 described above.

Semiconductor Layer 13

The semiconductor layer 13 is formed by layering the second conductive layer 10, the light-emitting layer 11, and the first conductive layer 12.

In the pixel region 1 illustrated in FIG. 3, the second conductive layer 10 includes a plurality of mesa shapes formed by dividing the semiconductor layer 13 into portions corresponding to each light-emitting element 100, leaving a portion of the second conductive layer 10 in a layer thickness direction. That is, the second conductive layer 10 is constituted by two regions in the layer thickness direction, and a region 10a on the light emission side is continuously connected across the entire pixel region 1. On the other hand, the other region 10b adjacent to the region 10a on the light emission side is formed into the plurality of mesa shapes 113. The mesa shapes 113 are spaced at a predetermined interval and constitute an array.

The P electrode 30 is connected to the first conductive layer 12 of each mesa shape 113 via a P contact film 14.

The semiconductor layer 13 is formed of a nitride semiconductor such as GaN. Specifically, the second conductive layer 10 can be an N-type layer, and an N-type layer having a well-known multilayer structure can be adopted. The light-emitting layer 11 includes a multiple quantum well layer composed of a InGaN layer or a GaN layer. The first conductive layer 12 can be a P-type layer, and a P-type layer made of a well-known multilayer structure can be adopted.

Each mesa shape 113 is covered by a protection film 18, excluding a connection portion of the P electrode 30 with the anode electrode 51. Specifically, the protection film 18 composed of an insulating material is formed on side surfaces of the mesa shape 113 extending in the layer thickness direction and an end portion of the mesa shape 113 on the first conductive layer 12 side. On the other hand, as illustrated in FIG. 3, the protection film 18 is not formed on a front surface of the region 10a on the light emission side of the second conductive layer 10 between two of the mesa shapes 113 adjacent to each other.

The step portion 213 provided in the connection region 2 illustrated in FIG. 4 is separated from the mesa shapes 113 by a groove 61 formed in the semiconductor layer 13 while leaving a portion of the second conductive layer 10 in the layer thickness direction. In short, the layered structure constituting the step portion 213 is the same as the layered structure constituting the mesa shape 113. In the connection region 2 as well, the region 10a on the light emission side of the second conductive layer 10 of the pixel region 1 described above is continuous, and a bottom surface of the groove 61 is constituted by the front surface of the region 10a on the light emission side. The bottom surface of the groove 61 is at the same height (position) in the layer thickness direction as that of the front surface of the region 10a on the light emission side. In short, a length of the step portion 213 in the layering (layer thickness) direction (height of the step portion 213) is equal to a length of the layering (layer thickness) of the mesa shape 113 (height of the mesa shape 113).

The step portion 213 is elongated along an edge of the pixel region 1, and has a length in the longitudinal direction substantially the same length as that of the edge of the pixel region 1 having a quadrilateral shape in top view. The groove 61 is also provided along the edge of the pixel region 1.

The common second electrode 32 is formed on the first conductive layer 12 of the step portion 213. Note that a contact film 15 is provided between the first conductive layer 12 and the common second electrode 32 and on a side surface of the step portion 213. The contact film 15 is a film formed of the same material and in the same process as those of the P contact film 14 formed below the P electrode 30. Note that the contact film 15 is not required for the common second electrode 32, but is preferably formed from the perspective of improving an adhesive force between the common second electrode 32 and the first conductive layer 12 and the like.

The step portion 213 is covered by the protection film 18 on an upper surface, excluding the contact film 15, and the side surface. The protection film 18 is formed of the same material as that of the protection film 18 described above. Specifically, examples include $SiO_2$ and SiN.

P Electrode 30

The P electrode 30, as illustrated in FIG. 1 and FIG. 2, has a size smaller than that of an upper surface of each mesa shape 113 in top view.

Common Second Electrode 32

The common second electrode 32, as illustrated in FIG. 1 and FIG. 2, is formed on the upper surface of the step portion 213 in a band shape at a size smaller than that of the upper surface in top view. Further, in top view, the size of the common second electrode 32 is larger than the size of the P electrode 30. The larger size facilitates alignment with the cathode electrode 52 of the driving circuit substrate 50. The common second electrode 32 is connected to the wiring line layer 31 at one location. In other words, one wiring line layer 31 is provided for one common second electrode 32. Nevertheless, the number is not limited thereto, and a plurality of wiring line layers 31 may be provided for one common second electrode 32. Further, the common second electrode 32 may have a size larger than that of the upper surface of the stepped portion 213. For example, the common second electrode 32 may be provided in a shape that covers the step portion 213.

Here, the common second electrode 32 and the P electrode 30 are at the same height (position) in the layer thickness direction. That is, a position of a connecting surface of the common second electrode 32 with the second driving electrode and a position of a connecting surface of the P electrode 30 with the first driving electrode are coplanar. In other words, the mesa shape 113 and the step portion 213 have the same height (layer thickness). Thus, the common second electrode 32 and the P electrode 30 have the same height, which has the advantage of not causing defects in the contact with the electrodes on the driving circuit substrate side.

Wiring Line Layer 31

The wiring line layer 31 extends in the pixel region 1 between the mesa shapes 113 to the edges of the pixel region 1. Furthermore, the wiring line layer 31 extends from the edges of the pixel region 1 to the groove 61 and into the connection region 2, extends over the side surface of the step portion 213, and is connected to the common second electrode 32 on the step portion 213.

Here, as illustrated in FIG. 1 and FIG. 2, the plurality of mesa shapes 113 disposed in an array are arrayed at equal intervals in a row direction, arrayed at equal intervals in a column direction, arrayed in the row direction, and arrayed in the column direction. Therefore, as illustrated in FIG. 1 and FIG. 2, the wiring line layer 31 extends in the row direction and the column direction. In other words, the wiring line layer 31 is formed in a lattice pattern in top view. Note that the wiring line layer 31 is not limited to the mode of the wiring line layer 31 of the present embodiment and, as explained in embodiments described below, the mode may be one in which the mesa shapes are in a staggered arrangement and the wiring line layer 31 is disposed in either the row direction or the column direction.

As illustrated in FIG. 3 and FIG. 4, the wiring line layer 31 is connected to a portion of the second conductive layer 10. Specifically, the wiring line layer 31 is connected to the front surface of the region 10a on the light emission side of the second conductive layer 10. The wiring line layer 31 is formed of the same conductive material as that of the common second electrode 32. Therefore, the wiring line layer 31 and the second conductive layer 10 are electrically connected, and a current from the P electrode 30 connected to the anode electrode 51 of the driving circuit substrate 50 (FIG. 2) that enters the mesa shape 113 passes through the region 10a on the light emission side of the second conductive layer 10 and the wiring line layer 31 and reaches the common second electrode 32. Thus, in the present embodiment, even in a configuration including a common second electrode outside the array, the wiring line layer 31 contributes to a reduction in resistance, making it possible to improve the light source quality compared to a configuration in which the wiring line layer 31 is not provided. Further, being formed of the same conductive material, the wiring line layer 31 and the common second electrode 32 can be formed at the same timing, which has the advantage that the process can be simpler. Note that the wiring line layer 31 is provided on the protection film 18 disposed on the side surface of the stepped portion 213.

Here, the P electrode 30, the common second electrode 32, and the wiring line layer 31 can be formed of the same conductive material. For example, the components can be formed of gold (Au) or, as long as the wiring line layer 31 is formed of a material having a higher light reflectivity than that of gold (Au), such as aluminum (Al) or silver (Ag), the light extraction efficiency of the light-emitting unit 200 can be further improved.

A layer thickness of the wiring line layer 31 is thinner than the layer thickness of the mesa shape 113, as illustrated in FIG. 3. In other words, a surface of the wiring line layer 31 on the side opposite to the surface in contact with the front surface of the region 10a on the light emission side of the second conductive layer 10 (hereinafter, referred to as the surface on the driving circuit substrate side) is in a position below the upper surface of the mesa shape 113 on the light emission side. In the present embodiment, the layer thickness of the wiring line layer 31 is thinner than a layer thickness of the region 10b of the second conductive layer 10 formed in the mesa shape 113. Further, as illustrated in FIG. 3, a surface of the wiring line layer 31 on the driving circuit substrate side between the mesa shapes 113 is flat. In other words, an element separation groove 60 between the mesa shapes 113 adjacent to each other remains between the mesa shapes 113 even though the wiring line layer 31 is disposed on the bottom surface of the element separation groove 60 (front surface of the second conductive layer 10 on the side near the driving circuit substrate 50 in the region 10a on the light emission side), making a depth of the element separation groove 60 shallow.

The protection film 18 is provided on the wiring line layer 31. The protection film 18 can be formed of the same material as that of the protection film 18 described above.

As described above, in the light-emitting unit 200 of the present embodiment, the wiring line layer 31 disposed between the mesa shapes 113 contributes to a reduction in resistance, making it possible to achieve a favorable light source quality even when the common second electrode 32 is provided outside the array.

FIG. 5 illustrates a cross section of the driving circuit substrate 50 along with a cross-section of the light-emitting unit 200 illustrated in FIG. 3 and FIG. 4. As described above, upper surfaces of the common second electrode 32 and the P electrode 30 of the light-emitting unit 200 are at the same height (position) in the layer thickness direction. Therefore, favorable contact can be achieved with the anode electrode 51 and the cathode electrode 52 of the driving circuit substrate.

(3) Driving Circuit Substrate

As illustrated in FIG. 2, the driving circuit substrate 50 is provided with the anode electrodes 51 and the cathode electrodes 52 on one side. The anode electrodes 51 are disposed in an array in a central pixel region in correspondence with the P electrodes 30 on each mesa shape. On the other hand, the cathode electrodes 52 are provided at positions facing the common second electrodes 32. Note that, for the specific configuration of the driving circuit substrate 50 other than that described here, a well-known configuration can be adopted.

(4) Manufacturing Method of Light-Emitting Unit 200

Figure 6:
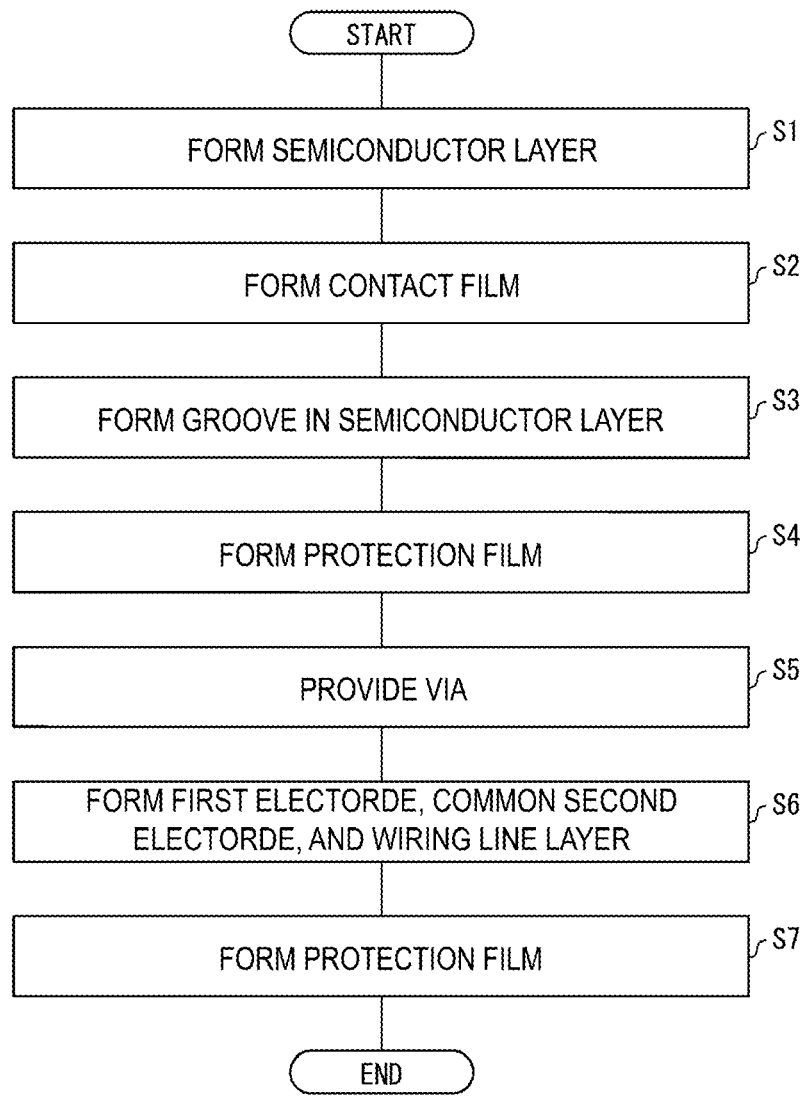
FIG. 6 is a flowchart for explaining a manufacturing method of the light-emitting unit provided in the image display element illustrated in FIG. 1.

Next, a manufacturing method of the light-emitting unit 200 will be described using FIG. 6 and FIG. 7. FIG. 6 is a flowchart illustrating the manufacturing process of the light-emitting unit 200, and FIG. 7 is a cross-sectional view of the light-emitting unit 200 illustrating the manufacturing process.

Figure 7:
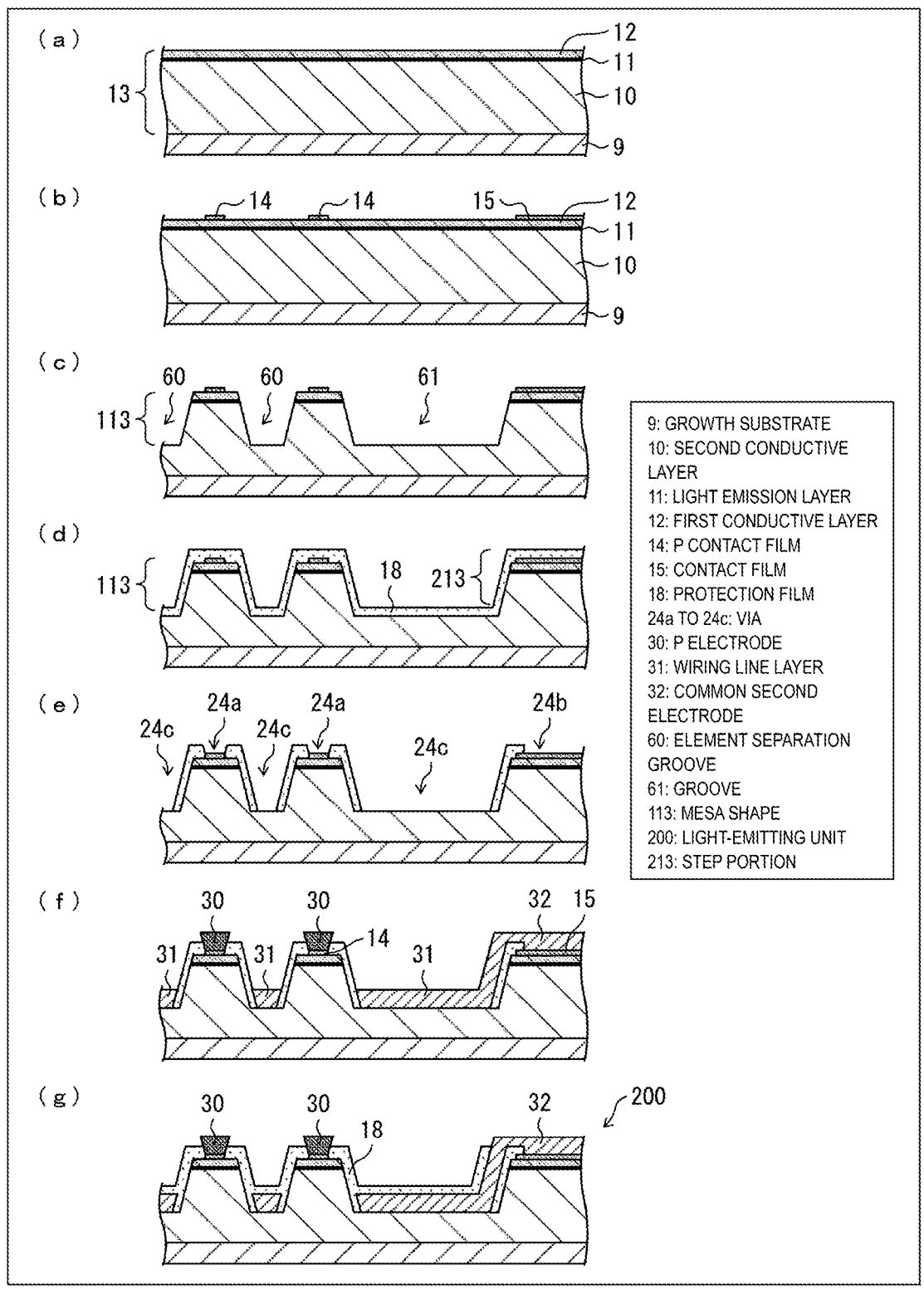
FIG. 7 is a cross-sectional view illustrating a manufacturing process of the light-emitting unit corresponding to the sequence illustrated in FIG. 6.

First, a growth substrate 9 made of a material such as sapphire, SiC, or Si is prepared, and a semiconductor layer such as GaN is grown on the growth substrate 9 by a metal organic chemical vapor deposition (MOCVD) device (step S1 of FIG. 6, (a) of FIG. 7). Specifically, first, the second conductive layer 10, which is an N-type layer, is grown, and then the light-emitting layer 11 and further the first conductive layer 12, which is a P-type layer, are grown. A layer thickness of the second conductive layer 10 is generally 10 µm or less, and preferably from 3 µm to 7 µm in particular. A layer thickness of the light-emitting layer 11 is generally from 10 nm to 200 nm, and preferably from 50 nm to 100 nm in particular. A layer thickness of the first conductive layer 12 is generally from 50 nm to 1000 nm, and preferably from 100 nm to 300 nm in particular.

Next, as illustrated in (b) of FIG. 7, contact films (P contact film 14 and contact film 15) are formed on the first conductive layer 12 (step S2 in FIG. 6). As the P contact film 14 formed on the upper surface of the portion that later becomes the mesa shape 113, a material having a low contact resistance with the first conductive layer 12 and a high light reflectivity at the interface with the semiconductor layer 13 is preferable. Metals like palladium (Pd) and nickel (Ni) are preferable. A film thickness of the P contact film 14 is preferably from 10 nm to 500 nm. On the other hand, palladium (Pd) or nickel (Ni) is deposited at a film thickness of about from 500 nm to 1000 nm on the contact film 15 formed on the upper surface of the portion that later becomes the step portion 213 ((b) of FIG. 7) as well.

Next, as illustrated in (c) of FIG. 7, the element separation groove 60 is formed in an outer peripheral portion of the light-emitting elements 100 in the pixel region 1. At the same time, the groove 61 is formed at a boundary position between the pixel region 1 and the connection region 2 (step S3 in FIG. 6). These grooves are formed by forming a resist pattern including an opening in the element separation groove 60 and the groove 61 by a normal photolithography process, and etching the semiconductor layer 13 by a dry etching device, leaving a portion of the second conductive layer 10. During this etching, it is desirable to provide an inclination to sidewalls of the element separation groove 60 and the groove 61, making it possible to further increase the light extraction efficiency by an angle of the inclination. On the other hand, when the inclination is large, the area required for one mesa shape (=subpixel) becomes large, making miniaturization no longer possible. Therefore, given $\theta$ as the angle formed by the sidewall of these grooves (side surface of the mesa shape) with the front surface of the semiconductor layer 13, $\theta$ is preferably set to a minimum value of about 60 degrees and is preferably about $\theta > 70$ degrees. Further, a groove width of the groove 61 is preferably the same as or greater than a groove width of the element separation groove 60. Thus, the mesa shapes 113 and the step portion 213 are formed. In short, the first conductive layer 12 of the mesa shape 113 and the first conductive layer 12 of the step portion 213 are composed of the same material, the light-emitting layer 11 of the mesa shape 113 and the light-emitting layer 11 of the step portion 213 are composed of the same material, and the second conductive layer 10 of the mesa shape 113 and the second conductive layer 10 of the step portion 213 are composed of the same material. Further, the first conductive layer 12 of the mesa shape 113 and the first conductive layer 12 of the step portion 213 have equal layer thicknesses, the light-emitting layer 11 of the mesa shape 113 and the light-emitting layer 11 of the step portion 213 have equal layer thicknesses, and the second conductive layer 10 of the mesa shape 113 and the second conductive layer 10 of the step portion 213 have equal layer thicknesses.

Next, the protection film 18 is formed. As a result, the protection film 18 is formed on the side surfaces of the mesa shape 113 and the side surface of the step portion 213 (step S4 in FIG. 6 and (d) of FIG. 7).

Next, the protection film 18 formed in step S3 is etched to form vias 24a, 24b, 24c in a portion of the upper surface of the mesa shape 113, a portion of the upper surface of the step 213, and the bottom surfaces of the element separation groove 60 and the groove 61 (step S5 of FIG. 6, (e) of FIG. 7).

Next, as illustrated in (f) of FIG. 7, a conductive material is deposited in the vias 24a, 24b, 24c to form the P electrode 30, the common second electrode 32, and the wiring line layer 31 (step S6 in FIG. 6). The P electrode 30, the common second electrode 32, and the wiring line layer 31 are composed of the same electrode material. As a result, the P electrode 30, the common second electrode 32, and the wiring line layer 31 can be formed simultaneously. Note that, in the via 24a on the upper surface of the mesa shape 113 and the via 24b on the upper surface of the step portion 213, there exist the contact films (P contact film 14 and contact film 15) formed earlier. The electrodes can be formed of Ti/Au and, because Ti is in contact with NGaN, can be configured as NGaN—Ti—Au and PGaN—Pd—Ti—Au on PGaN.

As the method of depositing the conductive material in the vias 24a, 24b, 24c illustrated in (f) of FIG. 7, vapor deposition or a sputtering method is used. The P electrode 30, the common second electrode 32, and the wiring line layer 31 need to be formed thicker than the protection film 18 formed earlier. For example, in a case in which a film thickness of the protection film 18 is about 0.1 μm, the films are formed to thicknesses of about from 0.2 μm to 0.8 μm.

Thus, according to the present embodiment, the P electrode 30, the common second electrode 32, and the wiring line layer 31 can be formed by a simple process. Examples of a comparative configuration include a configuration in which the groove between the mesa shape and the mesa shape is completely filled with the material of the wiring line layer. In this comparative example, the groove needs to be filled, and thus the P electrode and the common second electrode cannot be formed at the same timing, making the manufacturing process complex. In contrast, in the configuration of the present embodiment, the P electrode and the common second electrode can be formed at the same timing. A protection film is formed between the wiring line layer 31 and the side surface of the semiconductor layer constituting the mesa shape 113.

Next, as illustrated in (g) of FIG. 7, the protection film 18 is formed, excluding the upper surface and the vicinity of the upper surface of each of the P electrode 30 and the common second electrode 32 (step S7 in FIG. 6). Thus, the light-emitting unit 200 is formed. Note that step S7 can be omitted.

(5) Manufacturing Method of Image Display Element 3

The image display element 3 of the present embodiment can be manufactured by bringing the anode electrode of the driving circuit substrate 50 into contact with the upper surface of the P electrode 30 and bringing the cathode electrode of the driving circuit substrate 50 into contact with the upper surface of the common second electrode 32 of the light-emitting unit 200 manufactured in the manufacturing sequence described above.

(6) Advantages of Present Embodiment

According to the image display element of the present embodiment, a common second electrode corresponding to the N electrode of the light-emitting elements is provided outside the pixel region in which the light-emitting elements are disposed in an array. In a case in which a transparent electrode is used in the array to form the N electrode, the transparent electrode may cause crosstalk, which may affect the light source quality. Nevertheless, with a configuration in which the cathode is connected outside the array as in the present embodiment, improvement in quality as a light source and improvement in light extraction efficiency can be achieved.

Further, the wiring line layer provided between the mesa shapes functions as a resistance reduction layer and thus, from this as well, quality improvement as a light source can be achieved.

Further, with the technique of filling the spaces between the mesa structures with a material having high reflectivity, the manufacturing method is complex and warping may occur in the light-emitting elements. Nevertheless, according to the present embodiment, the groove between the mesa shapes is not completely filled with the wiring line layer, and the front surface of the wiring line layer on the driving circuit substrate side is at a position lower than that of the upper surface of the mesa shape (a position separated from the driving circuit substrate). Nevertheless, in the present embodiment, because the wiring line layer is in contact with the bottom surface of the element separation groove and provided in only a portion of the element separation groove, warping of the light-emitting element (light-emitting unit) can be suppressed compared to a configuration in which the groove is completely filled. Further, there is an advantage that the light-emitting unit can be formed by a simple process compared to the manufacturing process for the mode in which the groove between the mesa shapes is completely filled with the wiring line layer material.

Second Embodiment

Another embodiment of the disclosure will be described below. Note that, for convenience of explanation, components having a function identical to those in the above-described embodiment will be denoted by the same reference signs, and descriptions of those components will be omitted.

FIG. 8 is a cross-sectional view of an image display element according to the present embodiment. FIG. 8 corresponds to the cross-sectional view of FIG. 5 of the first embodiment.

The difference between the present embodiment and the first embodiment is in the shape of the wiring line layer 31A. Specifically, in the present embodiment, an end portion 31a of a wiring line layer 31A in the longitudinal direction rises along a wall surface of a sidewall 113a of the mesa shape 113. Then, when the mesa shapes 113 adjacent to each other and the wiring line layer 31A disposed between the mesa shapes 113 adjacent to each other are cut in a short-hand direction of the wiring line layer 31A, a cut surface of the wiring line layer 31A has a recessed shape that opens toward the driving circuit substrate 50. Note that the protection film 18 is provided between the end portion 31a and the sidewall 113a of the mesa shape 113, and the wiring line layer 31A is electrically connected to the upper surface of the region 10a on the light emission side of the second conductive layer 10.

The wiring line layer 31A of the first embodiment has a flat upper surface. In contrast, the wiring line layer 31A of the present embodiment has a recessed cross section in which an upper surface protrudes toward the upper surfaces of the mesa shapes 113 at the end portions 31a adjacent to the mesa shapes 113, causing the area between the mesa shape 113 and the mesa shape 113 to be recessed. In short, rather than completely filling the element separation grooves between the mesa shapes 113, the wiring line layer 31 of the present embodiment has a shape that covers the wall surfaces (including the bottom surface as well) of the element separation groove between the mesa shape 113 and the mesa shape 113 along undulations of the mesa shape 113, following the mesa shape.

The wiring line layer 31A of the present embodiment can be manufactured using the manufacturing method described in the first embodiment.

The light-emitting unit of the present embodiment also exhibits the same advantages as in the first embodiment. In addition, as long as the wiring line layer 31A is formed of a material having high reflectivity, the advantage of increasing the light extraction efficiency of the light-emitting element can be expected. This is because the light exiting the mesa shape is reflected by the wiring line layer 31A and brought directly upward.

Third Embodiment

Another embodiment of the disclosure will be described below. Note that, for convenience of explanation, components having a function identical to those in the above-described embodiment will be denoted by the same reference signs, and descriptions of those components will be omitted.

Figure 9:
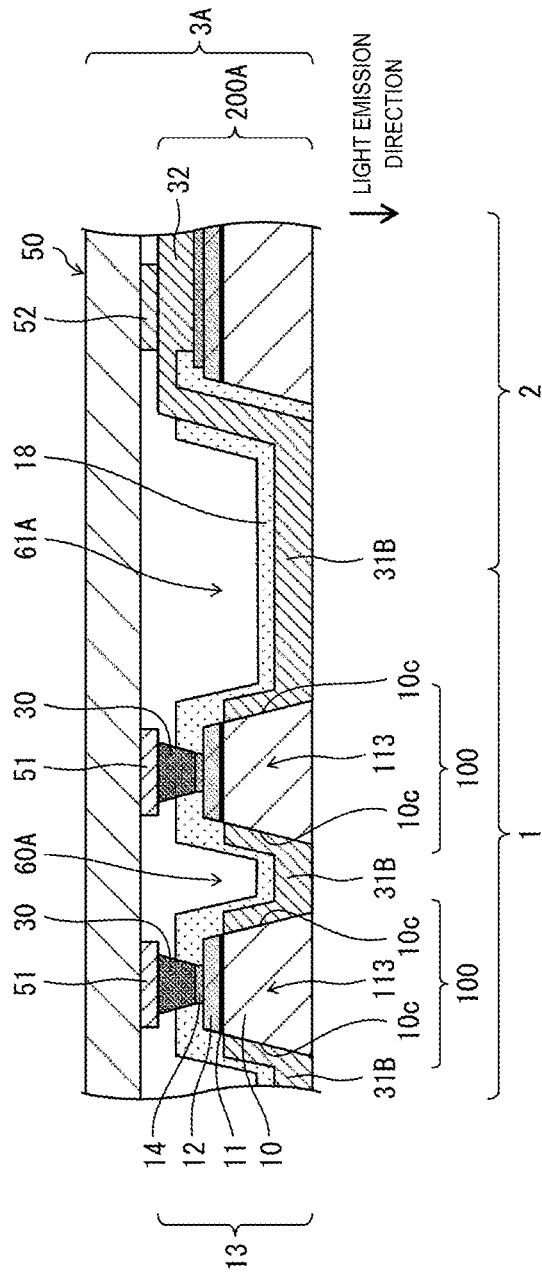
FIG. 9 is a partial cross-sectional view of an image display element according to third embodiment of the disclosure.

FIG. 9 is a cross-sectional view of an image display element 3A according to the present embodiment. FIG. 9 corresponds to the cross-sectional view of FIG. 5 of the first embodiment.

The difference between the present embodiment and the first embodiment is in the shapes of the semiconductor layer 13 and a wiring line layer 31B. Specifically, in the pixel region 1 of the light-emitting unit 200A of the present embodiment, the mesa shapes 113 are not connected to each other by the second conductive layer 10, and the semiconductor layer 13 is partitioned into portions corresponding to each light-emitting element 100. Further, in the connection region 2, the semiconductor layer 13 is completely partitioned in the layer thickness direction by the groove 61A, and the wiring line layer 31B is connected to a side surface 10c of the second conductive layer 10 of the mesa shape 113. In the following, description will be made with reference to FIG. 9.

(1) Light-Emitting Unit

In the light-emitting unit 200A, unlike the mode in which the mesa shapes 113 are connected to each other by the region 10a (FIG. 3 and FIG. 5) on the light emission side of the second conductive layer 10 as in the first embodiment, the mesa shapes 113 are structurally independent. This is because an element separation groove 60A formed in the semiconductor layer 13 in the pixel region 1 completely partitions the second conductive layer 10 in the layer thickness direction.

Further, a groove 61A between the connection region 2 and the pixel region 1 also, unlike the groove 61 of the first embodiment, completely partitions the second conductive layer 10 in the layer thickness direction.

In the present embodiment, the wiring line layer 31B is connected to the side surface 10c of the second conductive layer 10 of the mesa shape 113. As illustrated in FIG. 9, the wiring line layer 31B connects the side surfaces 10c of the second conductive layer 10 of the mesa shapes 113 adjacent to each other. As a result, a conductive path is formed between the second conductive layer 10 and the wiring line layer 31B.

The wiring line layer 31B is connected to the side surface 10c at a length shorter than a total length of the side surface 10c of the second conductive layer 10 formed in the mesa shape 113. Specifically, the wiring line layer 31B is preferably in contact with a length of about 80%, preferably about 90%, of the total length (from a bottom end of the mesa shape 113) of the side surface 10c of the second conductive layer 10. Further, including a process margin as well, the wiring line layer 31B is preferably in contact with a length of about 80%, preferably about 90%, of the total length (from the bottom end of the mesa shape 113) of the side surface 10c of the second conductive layer 10. In other words, the wiring line layer 31B is in contact with a major portion of the total length of the side surface 10c of the second conductive layer 10. This makes it possible to increase the light extraction efficiency of the light-emitting element.

Further, in the region between the mesa shapes 113 of the wiring line layer 31B, a layer thickness of the wiring line layer 31B is thinner than a layer thickness of the semiconductor layer 13 constituting the mesa shape 113. Specifically, the layer thickness of the region between the mesa shapes 113 of the wiring line layer 31B is the same as the layer thickness of the common second electrode 32.

According to the image display element 3A of the present embodiment, in the light-emitting unit 200A, the wiring line layer 31B is connected to the side surface 10c of the second conductive layer 10 formed in the mesa shape 113. The wiring line layer 31B and the second conductive layer 10 are electrically connected in this connection portion, and the current that enters the mesa shape 113 from the P electrode 30 connected to the anode electrode 51 of the driving circuit substrate 50 passes from the side surface 10c of the second conductive layer 10, through the wiring line layer 31B, and reaches the common second electrode 32. Thus, in the present embodiment as well, as in the first embodiment, in a configuration including a common second electrode outside the array, the wiring line layer 31B contributes to a reduction in resistance, making it possible to improve the light source quality compared to a configuration in which the wiring line layer 31B is not provided.

(2) Manufacturing Method of Light-Emitting Unit

Figure 10:
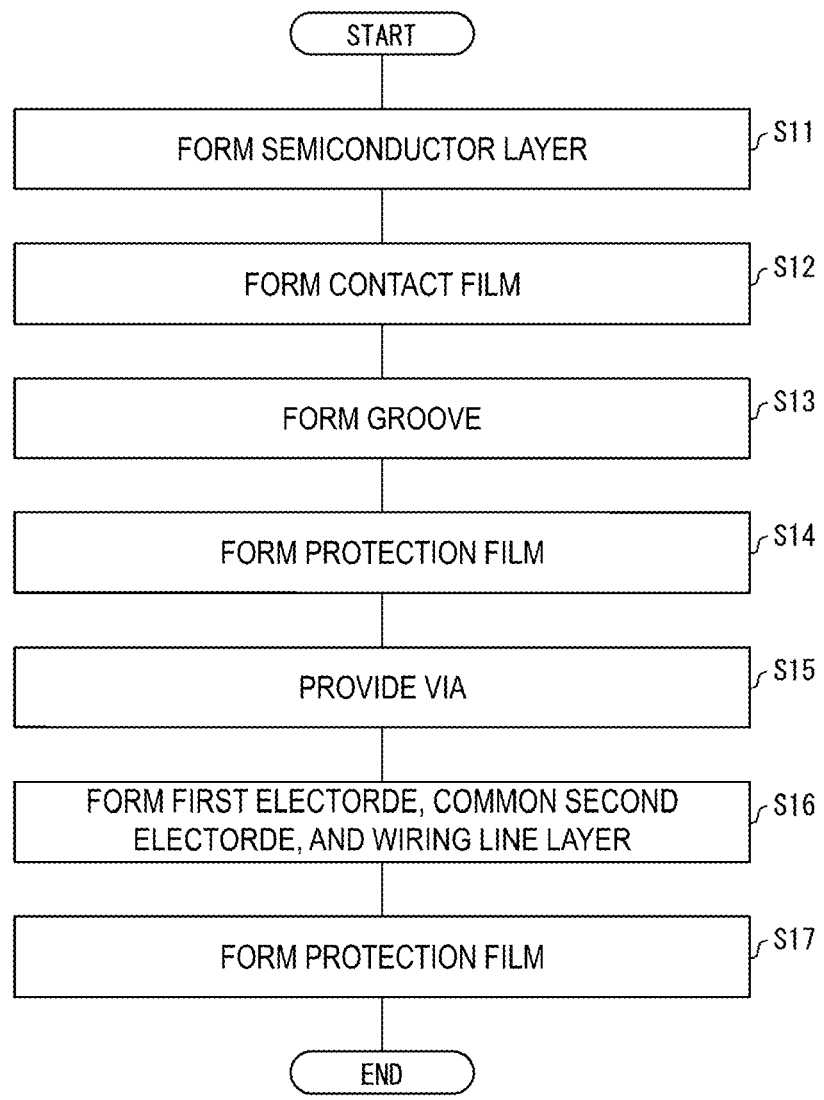
FIG. 10 is a flowchart for explaining a manufacturing method of a light-emitting unit provided in the image display element illustrated in FIG. 9.

Next, a manufacturing method of the light-emitting unit 200A will be described using FIG. 10 and FIG. 11. FIG. 10 is a flowchart illustrating a manufacturing process of the light-emitting unit 200A, and FIG. 11 is a cross-sectional view of the light-emitting unit 200A illustrating the manufacturing process.

Figure 11:
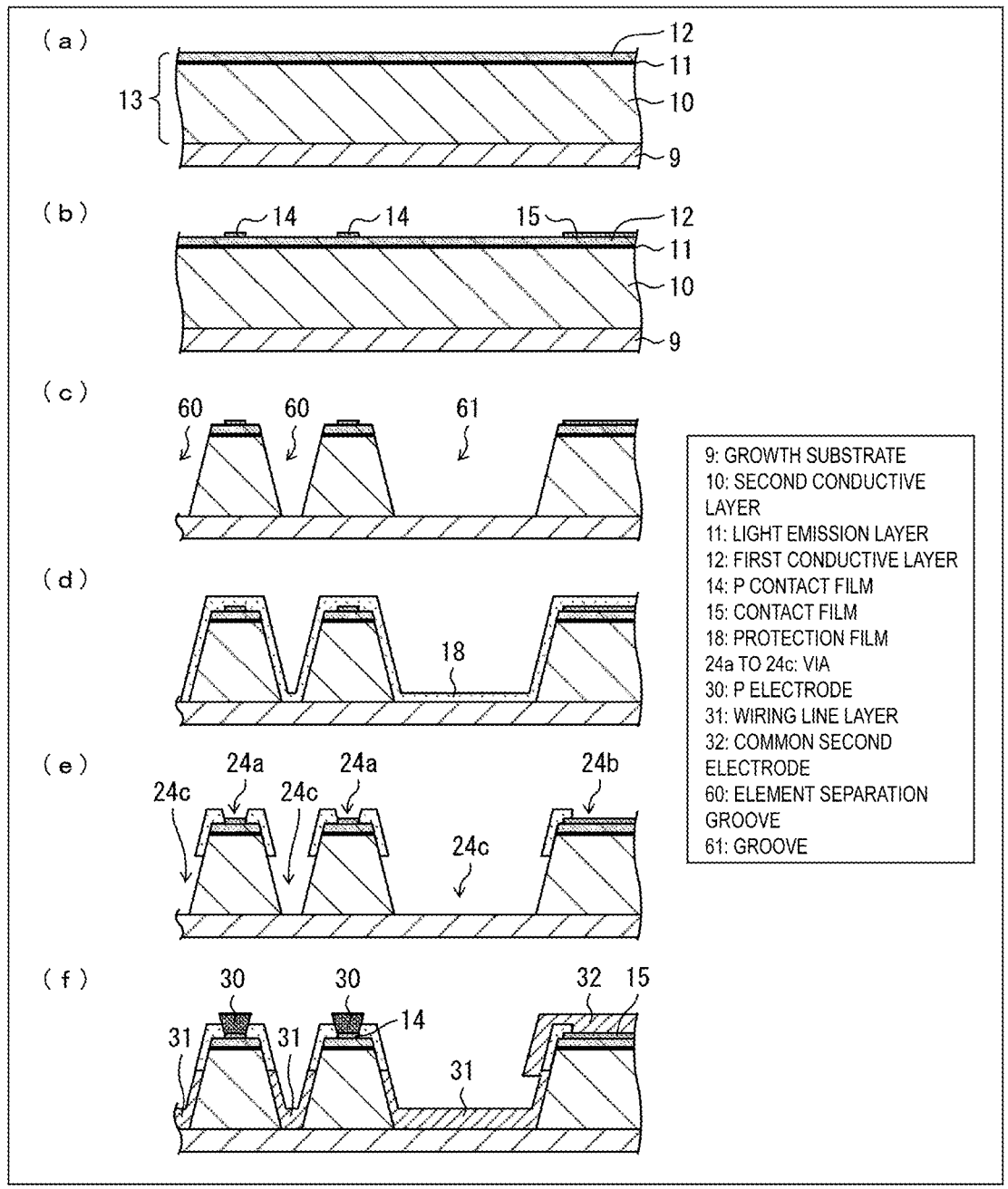
FIG. 11 is a cross-sectional view illustrating a manufacturing process of the light-emitting unit corresponding to the sequence illustrated in FIG. 10.

First, the growth substrate 9 made from a material such as sapphire, SiC, or Si is prepared, and the semiconductor layer 13 such as GaN is grown on the growth substrate 9 by an MOCVD device (step S11 of FIG. 10, (a) of FIG. 11). This step S11 is the same as step S1 described in the first embodiment.

Next, contact films (P contact film 14 and contact film 15) are formed on the first conductive layer 12 (step S12 in FIG. 10, (b) of FIG. 11). This step S12 is the same as step S2 described in the first embodiment.

Next, as illustrated in (c) of FIG. 11, the element separation groove 60 is formed in the outer peripheral portion of the light-emitting elements 100 in the pixel region 1. At the same time, the groove 61 is formed at the boundary position between the pixel region 1 and the connection region 2 (step S13 in FIG. 10). These grooves are formed by forming a resist pattern including an opening in the element separation groove 60 and the groove 61 by a normal photolithography process, and etching the semiconductor layer 13 by a dry etching device. At this time, the interface of the growth substrate 9 is cut away (not illustrated).

Next, the process proceeds to the formation step of the protection film 18 (step S14 in FIG. 10), the formation step of the vias (step S15 in FIG. 10), and the formation step of the P electrode 30, the common second electrode 32, and the wiring line layer 31B (step S16 in FIG. 10). These steps are the same as step S4, step S5, and step S6 in FIG. 6 of the first embodiment, and thus descriptions thereof will be omitted here.

Lastly, as in step S7 of FIG. 6 in the first embodiment, the protection film 18 is formed (step S17 in FIG. 10), excluding the upper surface and the vicinity of the upper surface of each of the P electrode 30 and the common second electrode 32. Thus, the light-emitting unit 200A is formed.

Fourth Embodiment

Another embodiment of the disclosure will be described below. Note that, for convenience of explanation, components having a function identical to those in the above-described embodiment will be denoted by the same reference signs, and descriptions of those components will be omitted.

Figure 12:
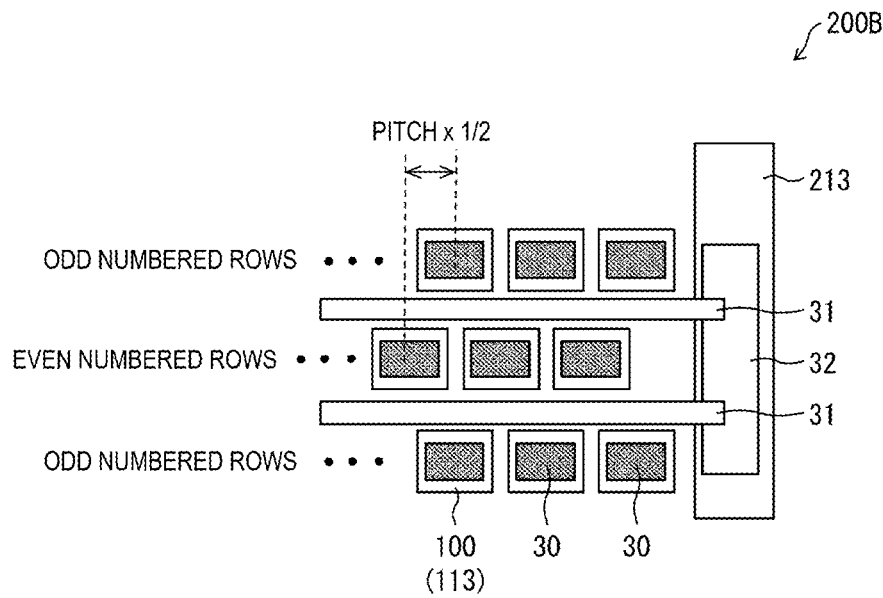
FIG. 12 is a partial top view of a light-emitting unit provided in an image display element according to a fourth embodiment of the disclosure.
Figure 13:
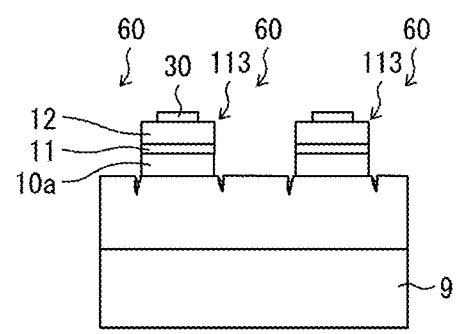
FIG. 13 is a partial cross-sectional view of the light-emitting unit illustrated in FIG. 12 during the manufacturing process.

FIG. 12 is a partial top view of a light-emitting unit 200B of the image display element of the present embodiment. FIG. 13 is a partial cross-sectional view illustrating a structure during the manufacturing process of the light-emitting unit 200B according to the present embodiment.

In the first embodiment described above, as illustrated in FIG. 1 and FIG. 2, a plurality of the light-emitting elements 100 (plurality of mesa shapes 113) are neatly arranged side-by-side in, for example, m rows and n columns along the edge of the rectangular pixel region 1 at a constant pitch. In this regard, the light-emitting unit 200B of the present embodiment also includes the plurality of the light-emitting elements 100 (plurality of mesa shapes 113) arrayed in m rows and n columns at a constant pitch. On the other hand, the light-emitting unit 200B of the present embodiment differs from the first embodiment in that odd numbered columns in a row direction are shifted by one-half the pitch with respect to even numbered columns.

Incidentally, in the light-emitting unit 200B of the present embodiment, when the groove is formed in the semiconductor layer in the formation step of the mesa shape 113, the groove may be formed to a location deeper than the boundary of the bottom end of the mesa shape as illustrated in FIG. 13. Thus, the element separation groove 60 formed between the mesa shape and the mesa shape may have a defective shape that can affect the wiring line layer 31 formed in a post process. Here, in a case in which the array of the plurality of light-emitting elements 100 (plurality of mesa shapes 113) is not shifted in pitch as in the first embodiment, there is a risk that the effect may extend to both the end portion on the one mesa shape 113 side and the end portion on the other mesa shape 113 side of the wiring line layer 31 disposed between the mesa shapes 113 adjacent to each other. On the other hand, by shifting the pitch and making the arrangement staggered as illustrated in FIG. 12, the effect can be limited to only one end portion of the wiring line layer 31 per one-half pitch. As a result, the occurrence of defects such as disconnection of the wiring line layer 31 can be reduced.

Fifth Embodiment

In the first embodiment described above, as illustrated in (e) of FIG. 7, the protection film 18 is provided on the side surface of the step portion 213. Nevertheless, an embodiment of the disclosure is not limited thereto. A fifth embodiment will be described below as a modified example of the first embodiment.

Figure 14:
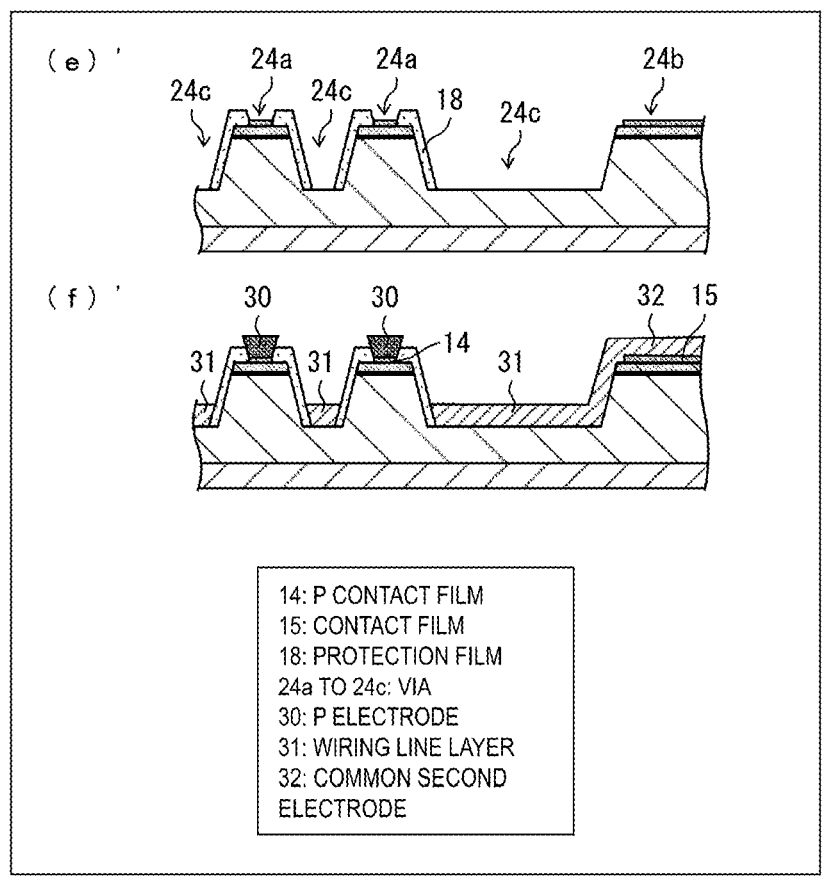
FIG. 14 is a partial cross-sectional view of a light-emitting unit provided in an image display element according to a fifth embodiment of the disclosure.

FIG. 14 is a cross-sectional view illustrating a portion of the manufacturing process of the light-emitting unit according to the present embodiment. (e)' of FIG. 14 corresponds to (e) of FIG. 7, and (f)' of FIG. 14 corresponds to (f) of FIG. 7. FIG. 14 differs from the configuration of FIG. 7 in that there is no protection film 18 on the side surface of the stepped portion 213. In short, in step S5 of forming the vias, in the present embodiment, the protection film 18 is removed from the side surface of the step portion 213 as well.

From the state illustrated in (e)' of FIG. 14, as step S6, the P electrode 30, the common second electrode 32, and the wiring line layer 31 are formed in the same manner as in step S6 of FIG. 6 of the first embodiment.

According to the manufacturing method of the present embodiment, because the protection film of the connection region is removed, the state is a PN short state. The connection region is an N-side electrode of the light-emitting elements in the array, and therefore unproblematic even in a short state.

Sixth Embodiment

In the third embodiment described above, as illustrated in (e) of FIG. 11, the protection film 18 is provided on the side surface of the step portion 213. Nevertheless, an embodiment of the disclosure is not limited thereto. A sixth embodiment will be described below as a modified example of the third embodiment.

Figure 15:
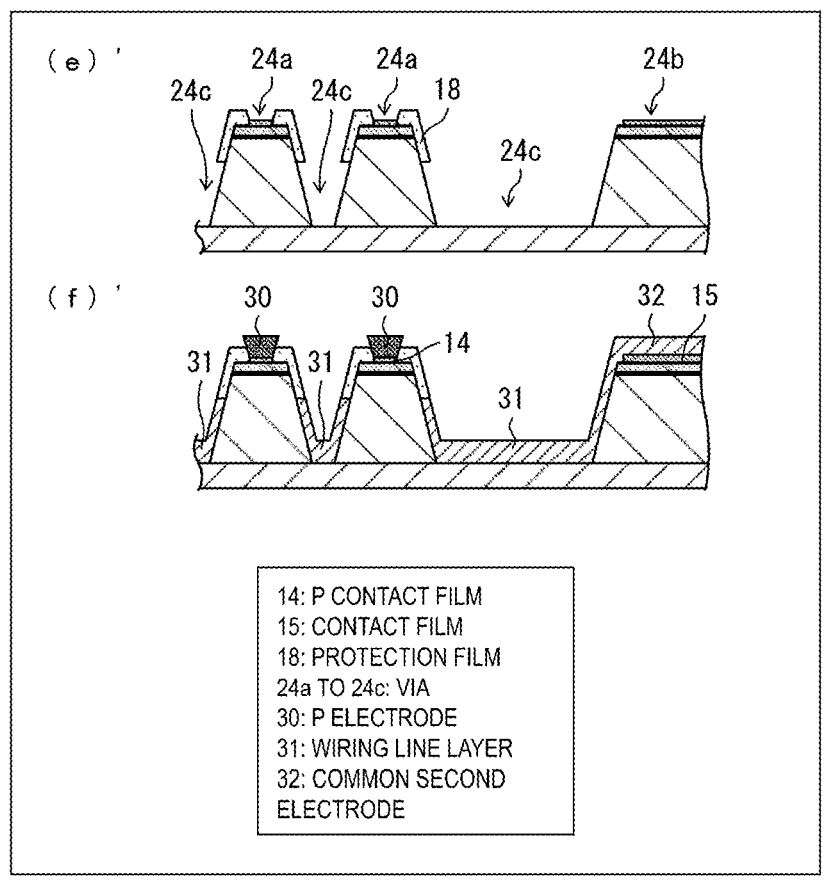
FIG. 15 is a partial cross-sectional view of a light-emitting unit provided in an image display element according to a sixth embodiment of the disclosure.

FIG. 15 is a cross-sectional view illustrating a portion of the manufacturing process of a light-emitting unit according to the present embodiment. (e)' of FIG. 15 corresponds to (e) of FIG. 11, and (f)' of FIG. 15 corresponds to (f) of FIG. 11. FIG. 15 differs from the configuration of FIG. 10 in that there is no protection film 18 on the side surface of the stepped portion 213. In short, in step S15 of forming the vias, in the present embodiment, the protection film 18 is removed from the side surface of the step portion 213 as well.

From the state illustrated in (e)' of FIG. 15, as step S16, the P electrode 30, the common second electrode 32, and the wiring line layer 31B are formed in the same manner as in step S16 of FIG. 10 of the third embodiment.

According to the manufacturing method of the present embodiment, because the protection film of the connection region is removed, the state is a PN short state. The connection region is an N-side electrode of the light-emitting elements in the array, and therefore unproblematic even in a short state.

Seventh Embodiment

In the third embodiment described above, as illustrated in (c) of FIG. 11, in the formation step of the vias, the second conductive layer 10 between the mesa shapes 113 is entirely removed and cut away to the interface of the growth substrate 9. In short, in the third embodiment, the mesa shape 113 and the mesa shape 113 are configured to not be connected by the second conductive layer 10. In the present embodiment as well, the mesa shape 113 and the mesa shape 113 are the same as those in the third embodiment in not being connected by the second conductive layer 10. On the other hand, while the steps up to formation of the P electrode 30, the common second electrode 32, and the wiring line layer 31B are the same as those of the first embodiment, the difference from the third embodiment is that the mesa shape 113 and the mesa shape 113 are connected by a portion of the second conductive layer 10. Then, in this state, after being electrically connected to the driving circuit substrate 50, a portion of the connected second conductive layer 10 is removed to realize the same mode as in the third embodiment. A seventh embodiment will be described below as a modified example of the third embodiment.

Figure 16:
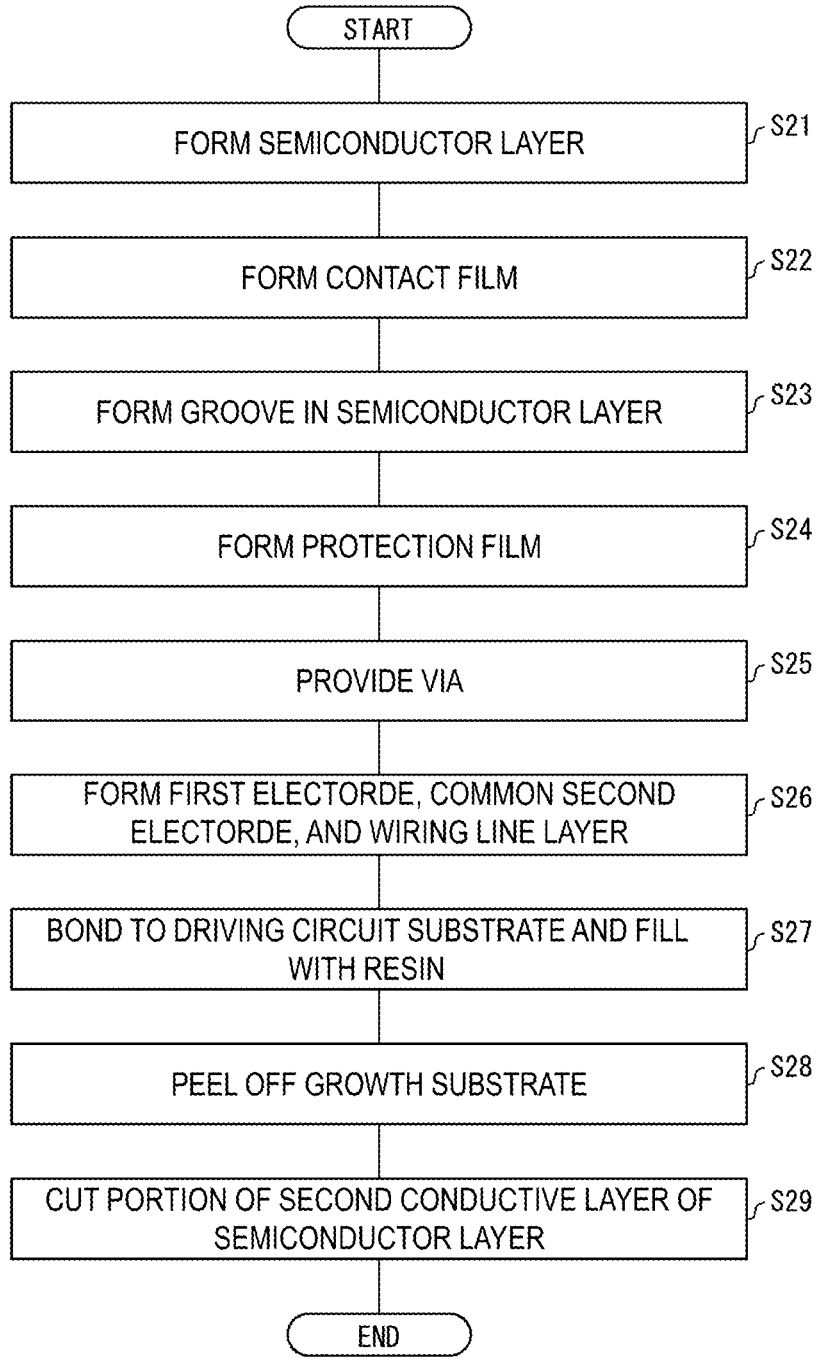
FIG. 16 is a flowchart for explaining a manufacturing method a light-emitting unit provided in an image display element according to a seventh embodiment of the disclosure.
Figure 17:
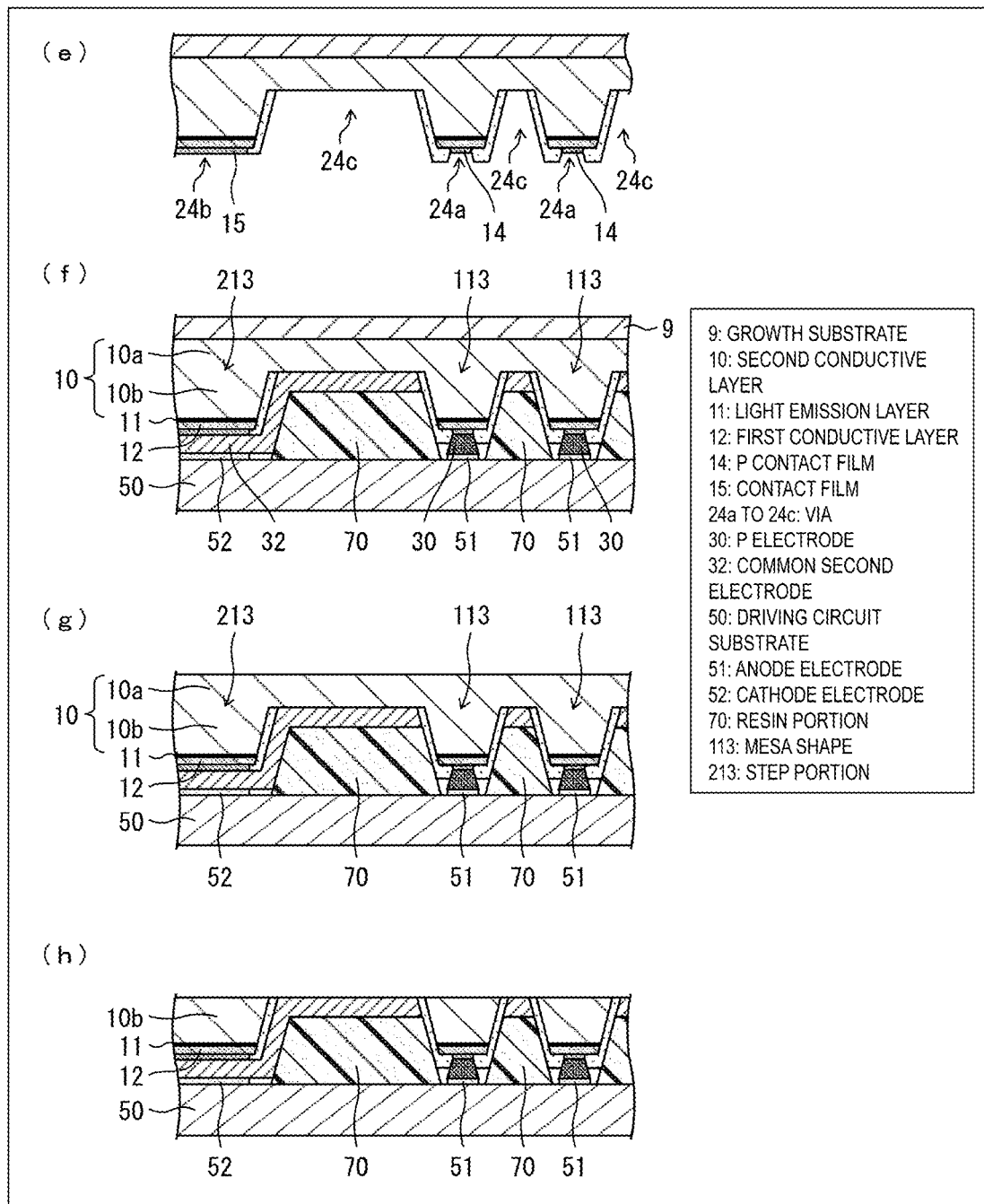
FIG. 17 is a partial cross-sectional view of the light-emitting unit provided in the image display element according to the seventh embodiment of the disclosure.

FIG. 16 is a flowchart illustrating a manufacturing process of the light-emitting unit 200 (image display element 3) of the present embodiment, and FIG. 17 is a cross-sectional view of the light-emitting unit 200 (image display element 3) illustrating the manufacturing process. Note that the steps of step S21 to step S26 in FIG. 16 are the same processes as step S1 to step S6 of FIG. 6 of the first embodiment, and thus descriptions thereof will be omitted.

In the state in which the P electrode 30, the common second electrode 32, and the wiring line layer 31B are formed in step S26 in FIG. 16 (state in (e) of FIG. 17), the bonding to the driving circuit substrate 50 is performed. Specifically, the anode electrode 51 of the driving circuit substrate 50 is brought into contact with the upper surface of the P electrode 30, and the cathode electrode 52 of the driving circuit substrate 50 is brought into contact with the upper surface of the common second electrode 32. Then, gaps formed by the bonding are filled with a resin portion 70 (step S27 in FIG. 16, (f) of FIG. 17).

Next, the growth substrate 9 is peeled off (step S28 in FIG. 16, (g) of FIG. 17).

Next, the second conductive layer 10 of the semiconductor layer 13 is cut away from the side where the growth substrate 9 was peeled, and the area between the mesa shape 113 and the mesa shape 113 adjacent to each other is cut away to a state of not being connected by the second conductive layer 10 (step S29, (h) of FIG. 17).

The configuration of the light-emitting unit 200 as in the third embodiment can also be realized by the manufacturing sequence described above.

Supplement

An image display element according to a first aspect of the disclosure is an image display element provided with a pixel region configured to display an image and a connection region provided outside the pixel region. The image display element includes a light-emitting unit including a plurality of light-emitting elements disposed in an array in the pixel region, and a driving circuit substrate facing the light-emitting unit and configured to drive the plurality of light-emitting elements. The light-emitting unit includes a semiconductor layer obtained by layering a second conductive layer, a light-emitting layer, and a first conductive layer in the pixel region and the connection region, a plurality of mesa shapes formed by dividing the semiconductor layer into portions corresponding to each of the plurality of light-emitting elements in the pixel region, and a step portion separated from the plurality of mesa shapes by a groove formed in the semiconductor layer in the connection region. A first electrode is connected to the first conductive layer of each of the plurality of mesa shapes. The first electrode is connected to a first driving electrode provided on an opposing surface of the driving circuit substrate facing the light-emitting unit. The light-emitting unit further includes, between the plurality of mesa shapes adjacent to each other, a wiring line layer forming a conductive path between the second conductive layers of the plurality of mesa shapes, the wiring line layer being thinner than a layer thickness of a portion of each of the plurality of mesa shapes in the semiconductor layer. The wiring line layer extends to a top of the step portion and is connected to a common second electrode provided on the step portion. The common second electrode is connected to a second driving electrode provided on the opposing surface of the driving circuit substrate.

According to the configuration described above, an image display element including a micro light-emitting element having high light source quality can be provided. Specifically, the configuration is such that connection to the cathode electrode is in a region (connection region) outside the light-emitting element array of the pixel region, and there is no N electrode that is a non-light-emitting portion in the array, making it possible to improve the light source quality. Further, with the arrangement of the wiring line layer, a reduction in resistance can be realized. Further, a configuration in which the space between the mesa shapes is completely filled with the wiring line layer is not adopted, making it possible to reduce the warping of the light-emitting unit. Further, a configuration in which the space between the mesa shapes is completely filled with the wiring line layer is not adopted, making it possible to form the wiring line layer in a simple process compared to the process of completely filling the space.

In the image display element according to a second aspect of the disclosure, in the first aspect, in the pixel region, the plurality of mesa shapes may divide the semiconductor layer into portions corresponding to each of the plurality of light-emitting elements, leaving a portion of the second conductive layer in a layer thickness direction. In the connection region, the step portion may be separated from the plurality of mesa shapes by the groove formed in the semiconductor layer, leaving a portion of the second conductive layer in the layer thickness direction. Further, the wiring line layer may be connected to the portion of the second conductive layer.

According to the configuration described above, the wiring line layer is connected to the portion of the second conductive layer, and thus the wiring line layer has a resistance reduction function, making it possible to improve the light source quality.

In the image display element according to a third aspect of the disclosure, in the first aspect, in the pixel region, the semiconductor layer may be partitioned into portions corresponding to each of the plurality of light-emitting elements without the plurality of mesa shapes being connected to each other by the second conductive layer. In the connection region, the semiconductor layer may be partitioned in a layer thickness direction by the groove. Further, the wiring line layer may be connected to a side surface of the second conductive layer of each of the plurality of mesa shapes.

According to the configuration described above, the wiring line layer is connected to the side surface of the second conductive layer, and thus the wiring line layer has a resistance reduction function, making it possible to improve the light source quality.

In the image display element according to a fourth aspect of the disclosure, in the first or second aspect, an end portion of the wiring line layer in a longitudinal direction may rise along a wall surface of a sidewall of each of the plurality of mesa shapes and, when the plurality of mesa shapes adjacent to each other and the wiring line layer disposed between the plurality of mesa shapes adjacent to each other are cut in a short-hand direction of the wiring line layer, a cut surface of the wiring line layer may have a recessed shape that opens toward the driving circuit substrate.

According to the configuration described above, a shape that follows along the undulations of the mesa shape is adopted and not a configuration in which the space between the mesa shapes is completely filled with the wiring line layer, making it possible to form the wiring line layer in a simple process compared to the process of completely filling the space.

In the image display element according to a fifth aspect of the disclosure, in the second aspect, a protection film is formed between the wiring line layer and the semiconductor layer formed in the plurality of mesa shapes.

According to the configuration described above, a path is formed in which current flows from a front surface of the portion of the second conductive layer of the mesa shape to the wiring line layer.

In the image display element according to a sixth aspect of the disclosure, in the first to fifth aspects, the first electrode and the common second electrode may be formed of the same electrode material.

According to the configuration described above, the manufacturing process can be simply achieved.

In the image display element according to a seventh aspect of the disclosure, in the first to sixth aspects, preferably a position of a connecting surface of the first electrode with the first driving electrode and a position of a connecting surface of the common second electrode with the second driving electrode are coplanar.

According to the configuration described above, favorable contact can be achieved with the first driving electrode and the second driving electrode of the driving circuit substrate.

In the image display element according to an eighth aspect of the disclosure, in the first to seventh aspects, preferably the first conductive layer of each of the plurality of mesa shapes and the first conductive layer of the step portion are equal in layer thickness, the light-emitting layer of each of the mesa shapes and the light-emitting layer of the step portion are equal in layer thickness, and the second conductive layer of each of the mesa shapes and the second conductive layer of the step portion are equal in layer thickness.

According to the configuration described above, each layer constituting the mesa shape and each layer constituting the step portion can be formed in the same process, making it possible to realize an image display element with improved productivity.

In the image display element according to a ninth aspect of the disclosure, in the first to eighth aspects, the wiring line layer may be constituted by a light-reflective material having higher reflectivity than gold (Au).

According to the configuration described above, the light extraction efficiency can be improved.

In the image display element according to a tenth aspect of the disclosure, in the first to ninth aspects, the array of the plurality of light-emitting elements formed in the pixel region may be arrayed in m rows and n columns at a constant pitch, and odd numbered columns in a row direction may be shifted by one-half the pitch with respect to even numbered columns.

According to the configuration described above, the effect of a micro trench (groove provided between a mesa shape and a mesa shape) formed in the semiconductor layer on the formation of the wiring line layer can be reduced.

The disclosure is not limited to each of the above-described embodiments. Various modifications are possible within the scope of the claims. An embodiment obtained by appropriately combining technical elements each disclosed in different embodiments falls also within the technical scope of the disclosure. Furthermore, technical elements disclosed in the respective embodiments may be combined to provide a new technical feature.

What is claimed is:

1. An image display element provided with a pixel region configured to display an image and a connection region provided outside the pixel region, the image display element comprising:
   a light-emitting unit including a plurality of light-emitting elements disposed in an array in the pixel region; and
   a driving circuit substrate facing the light-emitting unit and configured to drive the plurality of light-emitting elements,
   wherein the light-emitting unit includes
   a semiconductor layer obtained by layering a second conductive layer, a light-emitting layer, and a first conductive layer in the pixel region and the connection region,
   a plurality of mesa shapes formed by dividing the semiconductor layer into portions corresponding to each of the plurality of light-emitting elements in the pixel region, and
   a step portion separated from the plurality of mesa shapes by a groove formed in the semiconductor layer in the connection region,
   a first electrode is connected to the first conductive layer of each of the plurality of mesa shapes,
   the first electrode is connected to a first driving electrode provided on an opposing surface of the driving circuit substrate facing the light-emitting unit,
   the light-emitting unit further includes, between the plurality of mesa shapes adjacent to each other, a wiring line layer forming a conductive path between the second conductive layers of the plurality of mesa shapes, the wiring line layer being thinner than a layer thickness of a portion of each of the plurality of mesa shapes in the semiconductor layer, the wiring line layer extends to a top of the step portion and is connected to a common second electrode provided on the step portion, and the common second electrode is connected to a second driving electrode provided on the opposing surface of the driving circuit substrate.

2. The image display element according to claim 1, wherein in the pixel region, the plurality of mesa shapes divide the semiconductor layer into portions corresponding to each of the plurality of light-emitting elements, leaving a portion of the second conductive layer in a layer thickness direction, in the connection region, the step portion is separated from the plurality of mesa shapes by the groove formed in the semiconductor layer, leaving a portion of the second conductive layer in the layer thickness direction, and the wiring line layer is connected to the portion of the second conductive layer.

3. The image display element according to claim 2, wherein a protection film is formed between the wiring line layer and the semiconductor layer formed in the plurality of mesa shapes.

4. The image display element according to claim 1, wherein, in the pixel region, the semiconductor layer is partitioned into portions corresponding to each of the plurality of light-emitting elements without the plurality of mesa shapes being connected to each other by the second conductive layer, in the connection region, the semiconductor layer is partitioned in a layer thickness direction by the groove, and the wiring line layer is connected to a side surface of the second conductive layer of each of the plurality of mesa shapes.

5. The image display element according to claim 1, wherein an end portion of the wiring line layer in a longitudinal direction rises along a wall surface of a sidewall of each of the plurality of mesa shapes, and when the plurality of mesa shapes adjacent to each other and the wiring line layer disposed between the plurality of mesa shapes adjacent to each other are cut in a short-hand direction of the wiring line layer, a cut surface of the wiring line layer has a recessed shape that opens toward the driving circuit substrate.

6. The image display element according to claim 1, wherein the first electrode and the common second electrode are formed of the same electrode material.

7. The image display element according to claim 1, wherein a position of a connecting surface of the first electrode with the first driving electrode and a position of a connecting surface of the common second electrode with the second driving electrode are coplanar.

8. The image display element according to claim 1, wherein the first conductive layer of each of the plurality of mesa shapes and the first conductive layer of the step portion are equal in layer thickness, the light-emitting layer of each of the plurality of mesa shapes and the light-emitting layer of the step portion are equal in layer thickness, and the second conductive layer of each of the plurality of mesa shapes and the second conductive layer of the step portion are equal in layer thickness.

9. The image display element according to claim 1, wherein the wiring line layer is constituted by a light-reflective material having higher reflectivity than gold (Au).

10. The image display element according to claim 1, wherein the array of the plurality of light-emitting elements formed in the pixel region are arrayed in m rows and n columns at a constant pitch, and odd numbered columns in a row direction are shifted by one-half the pitch with respect to even numbered columns.

* * * * *